United States Patent [19]

Scott

[11] Patent Number: 4,630,248
[45] Date of Patent: Dec. 16, 1986

[54] SOUND ACTIVATED LAMP ARRANGEMENT

[75] Inventor: Robert J. Scott, 68A Lake Tapawingo, Blue Springs, Mo. 64015

[73] Assignee: Robert J. Scott, Blue Springs, Mo.

[21] Appl. No.: 543,510

[22] Filed: Oct. 19, 1983

[51] Int. Cl.[4] .................... G08B 13/22; H01H 36/00; H05B 37/02
[52] U.S. Cl. .................... 367/197; 315/360; 307/117; 340/566
[58] Field of Search ............... 367/197; 307/116, 117, 307/157; 340/326, 332, 566; 362/394, 395, 435, 443, 457, 811, 276, 802; 315/134, 136, 149, 156, 159, 360, 362

[56] References Cited

U.S. PATENT DOCUMENTS

| | | |
|---|---|---|
| 2,443,845 | 1/1948 | Hayes et al. |
| 2,572,815 | 10/1951 | Laporte |
| 2,608,614 | 8/1952 | Williams |
| 2,810,066 | 10/1957 | Green ................................. 362/395 |
| 2,931,020 | 3/1960 | Bender |
| 3,286,126 | 11/1966 | Crawford ........................... 315/159 |
| 3,440,347 | 4/1969 | Spencer ............................. 307/117 |
| 3,582,671 | 6/1971 | Ott ..................................... 307/117 |
| 3,893,081 | 7/1975 | Hopkins ............................. 367/197 |
| 4,001,805 | 1/1977 | Gibbs |
| 4,211,959 | 7/1980 | Deavenport ...................... 315/362 |
| 4,258,291 | 3/1981 | Scott et al. ........................ 367/197 |
| 4,334,172 | 6/1982 | Wyner et al. ...................... 307/157 |
| 4,344,071 | 8/1982 | Allen ................................. 340/566 |
| 4,422,018 | 12/1983 | Bailey ............................... 315/360 |
| 4,433,362 | 2/1984 | Ban .................................... 315/360 |
| 4,476,554 | 10/1984 | Smith ................................. 367/197 |

FOREIGN PATENT DOCUMENTS 1159964 7/1969 United Kingdom .

Primary Examiner—Donald J. Yusko
Attorney, Agent, or Firm—Litman Day & McMahon

[57] ABSTRACT

A sound activated lamp arrangement includes a module having a threaded lamp bulb socket at one end and a bulb base at the other end for reception in a lamp socket of a conventional table lamp. A lamp bulb is received in the module socket, and a microphone is provided on the module. Circuitry within the module connects the module socket with the module base to thereby illuminate the lamp bulb in response to the reception of an acoustic signal from a smoke alarm device, burglar alarm, or other type of alarm device by the microphone. A photocell is provided on the module and is connected to the circuitry to sense ambient illumination. The circuitry is adapted such that the bulb is only illuminated when the photocell senses darkness. A push button switch is provided on the module for conventional operation of the lamp. A collar is received on the socket shell of the lamp to prevent operation of the lamp switch thereon. For commercial applications, the module is provided with outwardly projecting lugs which engage the harp structure of the lamp to resist removal of the module from the table lamp.

10 Claims, 9 Drawing Figures

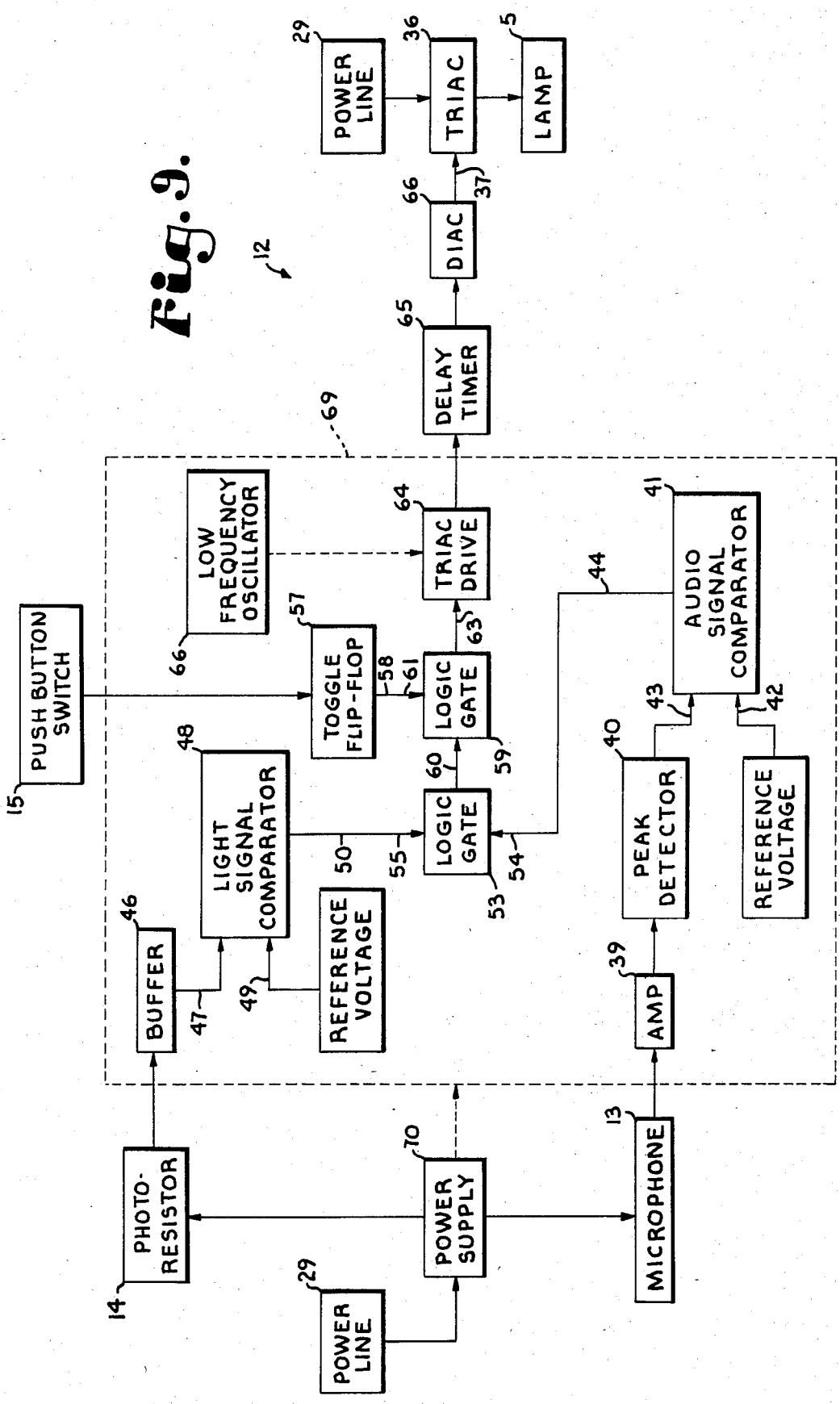

SOUND ACTIVATED LAMP ARRANGEMENT

FIELD OF THE INVENTION

The present invention relates to emergency illumination devices and, more particularly, to a lamp arrangement for illuminating a lamp in darkness in response to a sound signal from an alarm device.

BACKGROUND OF THE INVENTION

Smoke alarm devices have been developed to alert the occupants of rooms and buildings to take emergency action in the earliest stages of a fire. It is generally recommended by fire safety experts that a building in which a developing fire is suspected be immediately evacuated in a orderly manner. In the daytime, there is generally no problem. However, if the occupants of a building are aroused from sleep by an alarm from a smoke detector, there is likely to be confusion and panic in attempting to escape from the building. Further, injuries from obstacles unseen in the darkness are a possibility as the occupants move about in attempting to find light switches and evacuate the building. At least one nationally advertised smoke alarm device includes a lamp thereon which illuminates when the alarm is triggered. However, since placement of a smoke alarm device is governed by the flow of air currents in an arrangement of rooms, it is possible that a light provided by such a device would not be provided in a location which would be useful to a just awakened occupant. In addition, since the device is battery operated, the intensity and duration of illumination would depend upon the condition of the battery at the time that the device is triggered.

There are other types of sound signals for which the illumination of a lamp, particularly at night, might be desirable. These may include moisture alarms associated with appliances or other equipment as in basements, freeze alarms to warn citrus growers for example, of possibly damaging low temperatures, burglar alarms in some circumstances, and even telephones and alarm clocks. In the case of burglar alarms, particularly the less expensive systems, it might be desirable to cause lamps to be lit in response to the triggering of such an alarm to confuse or frighten a burlar, particularly in an unoccupied home.

In the case of persons having impaired hearing, audible alarms might not be loud enough to alert a person with severe hearing loss, particularly when such a person is asleep. A room lamp which illuminates in response to an audible alarm, particularly, a lamp which flashes might more reliably awaken a hearing impaired person.

Of the sound activated lamps heretofore known, most are specialized lamps rather than the general purpose lamps found in the living rooms and bedrooms of homes which are referred to herein as table lamps. At least one known lamp is constructed for use as a table lamp; however, this particular lamp has the control circuitry built therein. Such a specialty lamp would tend to be more expensive than generally available lamps and would not likely be available in a sufficient variety of styles to suit potential lamp buyers who are often particular about the coordination of styles in the decor of their rooms. Another arrangement provides a module which plugs into an electrical outlet and includes a socket to receive the plug of any lamp. This solves the lamp style problem but adds a control box which some might find objectionable.

SUMMARY OF THE INVENTION

The present invention provides a lamp arrangement which illuminates in response to the sound signal of an alarm device such as a smoke alarm device and which includes a module received in the socket of a conventional table lamp, the module receiving a light bulb therein, whereby the module is hidden by the shade of the lamp. The module includes a microphone, a photocell, and a switch and includes circuitry which interconnects the microphone, photocell, switch, the light bulb, and the module base. The microphone is frequency selective and converts sound signals to electrical signals. The circuitry is adapted to trigger only in response to a sound signal having greater than a minimum intensity and lasting longer than a minimum duration. The photocell senses ambient light and inhibits the circuitry from triggering except in darkness. The switch on the module provides for selective conventional operation of the lamp. The arrangement includes a collar which is received over the socket shell of the lamp structure and includes portions which cover the switch on the lamp to prevent use of this switch to operate the lamp. The module may include outwardly projecting lugs which engage a lamp shade supporting harp of the lamp structure to prevent removal of the module from the lamp. In a modified embodiment of the lamp arrangement, the module is provided with a portion of a conventional lamp socket shell which is received in the socket cap of a lamp structure in place of the conventional socket shell. Such a configuration of the lamp arrangement provides an apparently permanent installation thereof on a conventional lamp structure.

OBJECTS OF THE INVENTION

The principal objects of the present invention are: to provide a lamp arrangement for illumination in response to a sound signal from an alarm device such as a smoke alarm device, burglar alarm, or the like; to provide such an arrangement including a control module received in the socket of a conventional table lamp and having a lamp bulb therein; to provide such an arrangement which does not require alteration of the lamp in which it is employed; to provide such an arrangement including a photocell which senses ambient illumination and which inhibits triggering of the circuitry to illuminate the lamp bulb except in darkness; to provide such an arrangement including a module switch on the module for selective illumination of the bulb; to provide such an arrangement including a collar having enlarged portions which cover the switch on the lamp socket to prevent use of such a switch to illuminate the bulb; to provide such an arrangement wherein the module includes outwardly projecting lugs which engage the shade supporting harp of the lamp upon rotation of the module to resist removal of the module from the lamp assembly; to provide a modified embodiment of such an arrangement wherein the module includes a portion of a socket shell receivable in a socket cap of a lamp and including screw terminals for connection to a lamp cord for substantially permanent installation on a lamp assembly; and to provide such a lamp arrangement which is economical to manufacture, positive and durable in operation, and which is particularly well adapted for its intended purpose.

Other objects and advantages of this invention will become apparent from the following description taken in conjunction with the accompanying drawings wherein are set forth, by way of illustration and example, certain embodiments of this invention.

The drawings constitute a part of this specification and include exemplary embodiments of the present invention and illustrate various objects and features thereof.

BRIEF DESCRIPTION OF THE DRAWINGS

FIG. 9 is a block diagram of the lamp control circuit of the arrangement of the present invention.

DETAILED DESCRIPTION OF THE INVENTION

Figure 1:
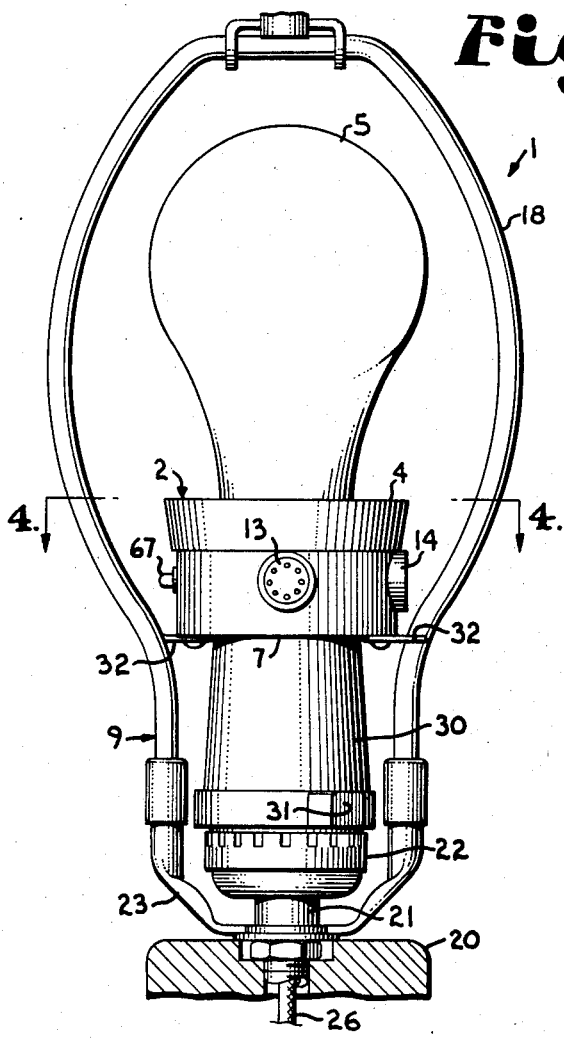
FIG. 1 is a front elevational view of a sound activated lamp arrangement according to the present invention.
Figure 2:
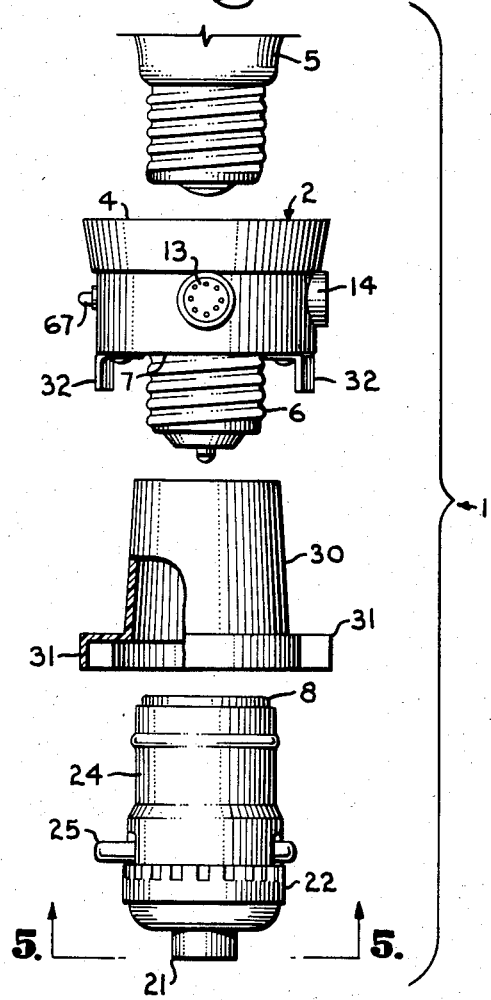
FIG. 2 is a fragmentary rear elevational view of the arrangement.

As required, detailed embodiments of the present invention are disclosed herein, however, it is to be understood that the disclosed embodiments are merely exemplary of the invention which may be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure.

Figure 3:
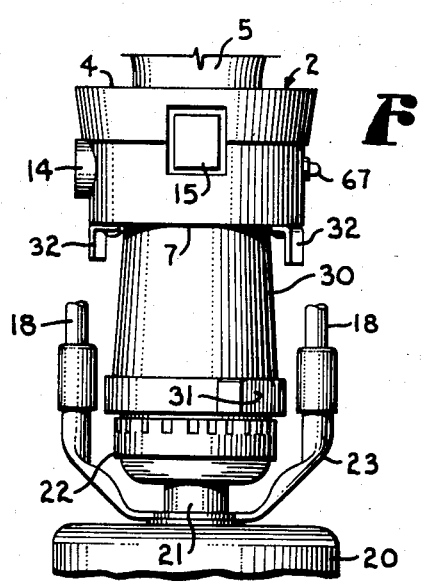
FIG. 3 is an exploded elevational view of the arrangement.
Figure 4:
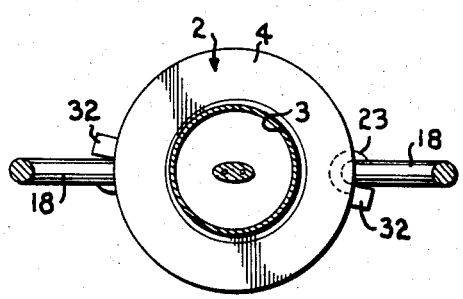
FIG. 4 is a top plan view along line 4—4 of FIG. 1 and illustrates lengagement of module removal prevention lugs and the harp legs of the lamp structure.
Figure 5:
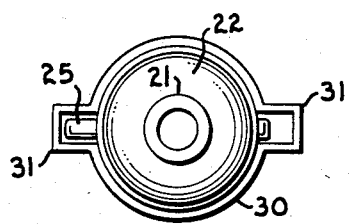
FIG. 5 is a bottom plan view along line 5—5 of FIG. 3 and illustrates details of a switch cover member of the arrangement.

Referring to the drawings in more detail:

The reference numeral 1 generally designates a smoke sound activated lamp arrangement according to the present invention which includes a control module 2 having a module socket 3 (FIG. 4) on a top end 4 to receive a lamp bulb 5 therein and a module base 6 (FIG. 3) on a bottom end 7 for reception in a socket 8 of a lamp assembly 9. The module 2 encloses a lamp control circuit 12 and has a microphone 13, a photocell 14, and a lamp control switch 15 mounted thereon and connected to the circuit 12. The circuit 12 interconnects the module base 6 with the module socket 3 and, upon being triggered by a sound signal of an alarm device (not shown) received by the microphone 13, applies electrical power available at the base 6 to the socket 3 to illuminate the bulb 5 therein.

The illustrated module 2 is partly cylindrical and partly conical and has a diameter to fit between the prongs or legs of a lampshade supporting harp 18 of the lamp assembly 9. The module should have a height such that a standard sized light bulb 5 can be installed therein when the module is in place on a lamp assembly 9. The module is formed of a plastic for electrical insulation purposes and for ease of manufacture. Depending upon the wattage of the bulbs 5 recommended for use in the module 2, it might be desirable to provide vents (not shown) through the surfaces of the top and bottom ends 4 and 7 of the module to provide for convective cooling of the components for the circuit 12.

Figure 6:
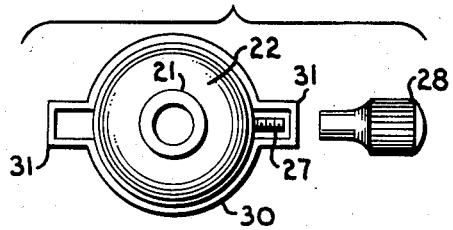
FIG. 6 is a view similar to FIG. 5 and illustrates the switch cover member in relation to a rotary type lamp switch.

The lamp assembly or structure 9 is of the type found on conventional household lamps, such as table lamps. The assembly 9 is usually mounted on a free standing lamp base or pedestal 20. The assembly 9 includes a neck 21 supporting a socket cap 22 and, optionally, a harp wing 23. A socket shell 24 having the lamp bulb socket 8 positioned therein is snapped into and supported by the socket cap 22. The socket 8 usually includes a lamp switch 25 which may be either a slide switch (FIGS. 1-5) or a rotary switch (FIG. 6). Terminals, such as screw terminals, (not shown), are also provided on the socket 8 for connection of a lamp power cord 26 thereto. Alternatively, some lamps have the switch 25 mounted on the pedestal 20. The switching mechanism of the switch 25, for a single wattage bulb lamp, is usually a single pole, single throw switch connected between one of the conductors of the power cord 26 and one of the contacts of the lamp socket 8. The socket 8 is a standard threaded AC lamp bulb socket. The ends of the harp 18 are removably received in the outer ends of the harp wing 23. The harp 18 supports a lamp shade (not shown) in surrounding relation to the bulb 5. Some types of lamps, particularly small bedroom type lamps, do not include a harp 18 or harp wing 23. On such lamps, the shade is usually supported by resilient metal rings which snap directly onto the lamp bulb 5.

For the arrangement 1 to respond to a sound signal, the power cord 26 must be plugged into a receptacle of an electrical power line 29 and the lamp switch 25 must be in the "on" position thereof. In order to prevent the use of the lamp switch 25 for normal operation of the lamp, which might leave the switch 25 in the "off" position thereof thereby rendering the module 2 unresponsive to a smoke alarm signal, the arrangement 1 includes a lamp switch cover member 30. The illustrated cover 30 is a collar which is placed on the socket shell 24 prior to insertion of the module 2 into the lamp assembly socket 8. The cover 30 includes expanded portions 31 which fit over the operating portions of the lamp switch 25 to prevent access thereto. The illustrated socket shell 24 has a side-to-side type of slide switch; therefore, the cover member 30 includes a pair of expanded portions 31. A cover member 30 for use on a socket shell 24 having a rotary type of switch 25 (as shown in FIG. 6) would only require a single expanded portion 31 for covering the switch; however, the position of the threaded shank 27 on which the knob 28 is positioned is located at about the same position as the operator member of the switch 25. Therefore, the cover member 30 can be used with either slide or rotary type lamp switches. When the arrangement 1 is used with a lamp having a rotary type switch, the knob 28 is simply removed by unscrewing same after the switch has been turned on. Lamps on which the switch 25 is located on the lamp pedestal 20 or a lamp base (not shown) can be provided with a plug member (not shown) for insertion into the mounting hole provided for the switch. On such a lamp the switch 25 would be placed in the "on" condition thereof, and then the mounting nut of the switch would be removed and the switch would be pressed into the cavity of the lamp pedestal 20 or base.

In order to deter removal of the module from the module socket 24, the illustrated module 2 is provide with removal prevention lugs 33. The lugs 33 project outwardly from the module 2 and are positioned to engage the harp 18 upon rotation of the module 2, to prevent further rotation thereof. The lugs 33 could be removably attached to the module 2 to allow removal thereof for use of the module in private homes. The main purpose of the lugs 33 is to prevent easy removal of the module 2 when employed in commercial installations such as hotels, motels, and the like. Alternatively, the lugs 33 could be made of a bendable metal and permanently attached such that the lugs could be bent downwardly to clear the harp 18.

In general, the control circuit 12 includes a controlled switching element which responds to certain types of sound signals received by the microphone 13. In the illustrated circuit, the switching element is a triode AC semiconductor switch or triac 36. The triac 36 is switched into conduction to transfer electrical power from the power line 29 through the lamp 5 upon the receipt of a gate signal at a gate terminal 37 of the triac. The microphone 13 is connected through an amplifier 39 and a peak detector circuit 40 to an audio signal comparator 41. The amplifier 39 may be implemented as an active filter and incorporate elements of a low pass filter, a high pass filter, a band pass filter or any required combination thereof including multiple band pass filters. The comparator 41 has a reference voltage connected to a first input 42 thereof and the peak detector 40 connected to a second input 43 thereof. The comparator 41 has an activated output signal whenever the signal from the peak detector 40 exceeds the first reference voltage by a certain level. The peak detector 40 receives the amplified signal from the microphone 13 and stores the highest level of the microphone signal for a selected length of time. The amplifier 39 increases the level of the electrical signal from the microphone 13 and provides scaling of the output signal by the manner in which it is biased. The microphone 13 is preferably frequency selective and has a pass band which includes the acoustic frequencies of the signals of conventionally available smoke alarm devices or other alarm devices to which the circuit 12 is to respond. Alternatively, separate frequency selection components such as filters may be connected between the microphone 13 and amplifier 39. Under some circumstances, it might be desirable for the microphone 13 and amplifier 39 to be responsive to ultrasonic signals, as when the arrangement is used with certain types of burglar alarms. In the illustrated circuit 12 the comparator 41 has a logic one on the output 44 thereof whenever the sound level sensed by the microphone 13 exceeds about eighty decibels.

Activation of the lamp 5 in response to a smoke alarm signal is usually only desirable in darkness since the illumination provided thereby is not required for evacuation of the room or building if adequate lighting is already available. Therefore, the arrangement is provided with the photocell 14 and circuitry which inhibits response to the smoke alarm signal when sufficient illumination is present. The illustrated photocell 14 is a light dependent resistor or photoresistor whose resistance varies in proportion to the illumination incident thereon. The photoresistor 14 is connected in a voltage divider network (not shown) in a conventional manner, and the network is connected through a buffer amplifier or voltage follower 46 to a first input 47 of a light signal comparator 48. The comparator 48 has a second reference voltage connected to a second input 49. The comparator 48 operates in a manner similar to the audio signal comparator 41 and has a logic one on an output 50 whenever the signal on the first input 47 exceeds the reference voltage on the second input 49 by a selected amount. The illustrated comparator has such an activated output whenever the light intensity sensed by the photoresistor 14 exceeds about 10 lux.

The logic conditions generated by the audio comparator 41 and the light comparator 48 are combined and interpreted by a first logic gate 53 having the audio comparator connected to the first input 54 and the light comparator connected to a second input 55 thereof. In order to provide for selective conventional operation of the lamp 5, the arrangement 1 is provided with the lamp control switch 15. The illustrated switch 15 is a push button monentary contact switch connected to a toggle flip-flop 57. The flip-flop 57 is operative to alternate the logic level on an output 58 thereof each time the switch 15 is operated. By this means, if operation of the switch 15 causes illumination of the lamp 5, the next operation of the switch 15 extinguishes the lamp. The logic conditions provided by the flip-flop 57 and the first logic gate 53 are combined by a second logic gate 59 having the gate 53 connected to a first input 60 and the flip-flop 57 connected to a second input 61. It is desirable for the gate 59 to have an activated output logic level for one of the states of the flip-flop 57 or for a combination of conditions which indicate that the microphone 13 is receiving a suitable acoustic signal and that the photoresistor 14 is sensing darkness. Any combination of logic elements which accomplishes these purposes may be employed. In the illustrated circuit 12, the first logic gate 53 is an AND gate with the second input 55 from the light comparator 48 inverted, and the second logic gate 59 is an OR gate.

The output 63 of the second logic gate 59 is connected to a triac drive amplifier 64. The amplifier 64 provides the gate signal for the triac 36. The amplifier 64 must have sufficient output voltage and current for such a gate signal to pass through any intervening circuit elements between the triac drive 64 and the gate 37 of the triac. The illustrated circuit 12 includes a delay timer 65 and a diode AC switch or diac 66. The timer 65 and diac 66 guard against false triggering of the triac 36 due to short duration transients in the case of the timer 65 and transients which do not have sufficient level to trigger the diac 66. The illustrated diac 66 requires at least 26 volts to trigger into conduction. Normally, a smoke alarm device outputs an alarm signal continuously as long as smoke is sensed. Such a signal would have sufficient duration to exceed the time constant of the timer 65 and would be channeled through the triac drive amplifier 64 such that the gate signal provided by the amplifier 64 would have sufficient voltage to trigger the diac 66 into conduction. The delay timer 65 may be an RC timing network, a digital timer, or other type of timing device providing a delay of three to six seconds.

Under some circumstances it might be desirable for the lamp 5 to flash when responding to an alarm signal, such as for alerting persons with impaired hearing. For this purpose, the circuit 12 is provided with a low frequency oscillator 66 connected to the triac drive amplifier 64 and operative to cause a pulsing of the gate signal therefrom. In such a circumstance, it might be desirable to pass the oscillator signal through a logic gate (not shown) connected as to the output of the first logic gate 53 so that the lamp 5 can be controlled by operation of the switch 15 with flashing operation only occuring in response to the presence of a smoke alarm signal in darkness. The oscillator 66 would preferably be provided with a switch (not shown) for cancelling the flashing of the lamp after the alerting effect has been realized to avoid the visual nuisance of trying to see in the presence of flashing illumination. The circuit 12 may also be provided with a pilot light or LED 67 connected, for example, to the output 50 of the light signal comparator 48 to indicate that the circuit 12 is in an armed or monitoring state.

It is desirable for the circuitry 12 to be miniaturized in order to fit into the module 2. One means of accomplishing this is a hybrid integration of a major portion of the circuit 12. In such a technique, monolithic chips implementing the major functional components of the circuit are conductively bonded to a substrate having conductive patterns thereon. Such a package bears a resemblence to and has pin spacing compatibility with conventional dual-in-line packages. In FIG. 9, the functional blocks enclosed within the broken line rectangle 69 would be provided in such a hybrid integrated package. The remaining elements of the circuit 12 would be positioned external to the package 69 including the microphone 13, photoresistor 14, push button switch 15, timer 65, diac 66, and triac 36. Also the power supply 70 for the circuit 12 would be external to the package 69. Preferably, the power supply includes a voltage regulation element (not shown) either externally, or within the package 69.

Figure 7:
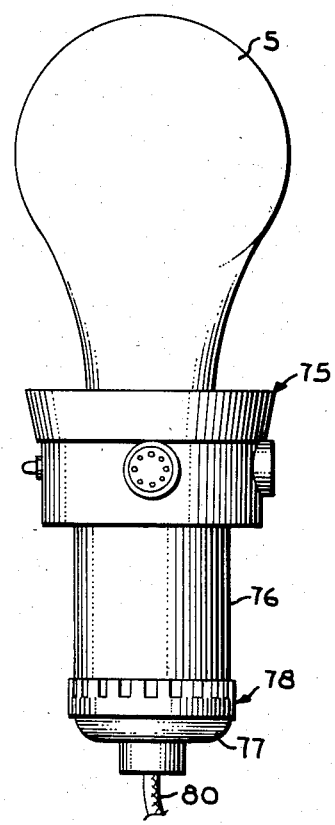
FIG. 7 is a fragmentary front elevational view of a modified embodiment of the arrangement according to the present invention.
Figure 8:
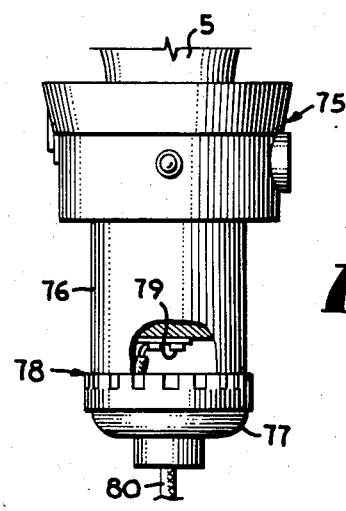
FIG. 8 is a fragmentary rear elevational view of the modified embodiment of the arrangement.

FIGS. 7 and 8 illustrate a modified embodiment of the arrangement 1 according to the present invention. A modified module 75 includes a socket shell portion 76 thereon which is adapted for direct mounting by snapping of the shell portion 76 into the socket cap 77 of a lamp assembly 78. By this means, the modified module 75 has the appearance of an original component of the lamp assembly 78 such that there is a lessened possibility of attempted removal of the module 75 from the lamp assembly 78. The module 75 may be provided with terminals, such as screw terminals 79, for connection of the lamp cord 80 directly to the module 75. The modified module 75 does not require the use of a lamp switch cover such as the cover 30 of the arrangement 1 since a conventional lamp assembly switch is not present. In a similar manner, rotation preventing lugs, such as the lugs 33 of the arrangement 1, are not required since the modified module 75 is not adapted for removal by unscrewing. The modified module 75 is adapted particularly for commercial installations in which attempted theft is a likely hazard. However, the modified module 75 is also suitable for household installation and use.

It is to be understood that while certain forms of the present invention have been illustrated and described herein, it is not to be limited to the specific forms or arrangement of parts described and shown.

What is claimed and desired to be secured by Letters Patent is as follows:

1. A lamp arrangement for the illumination of a lamp bulb fron an electrical power line in response to a sound signal from an alarm device and comprising:
   (a) a standard lamp socket assembly including:
      (1) a lamp bulb socket adapted to receive a bulb base of a lamp bulb therein;
      (2) a power cord to connect said lamp lamp socket to an electrical power line; and
      (3) a lamp switch connected between said power cord and said lamp socket to complete or break a circuit therebetween, said lamp switch including a lamp switch operator which is placed to complete a circuit between said power cord and said lamp socket;
   (b) a lamp switch cover received on said socket assembly in covering relation to said lamp switch operator to prevent access thereto;
   (c) a lamp control module having a module bulb base received in and connected with said lamp socket and having a module bulb socket similar to said lamp socket;
   (d) a lamp bulb received in said module socket;
   (e) a microphone positioned on said module;
   (f) lamp control means positioned in said module and having said microphone, said module bulb base, and said module bulb socket connected thereto; said circuit means being capable to assuming one of only two states including an armed state in which said circuit means is caused to operatively interconnect said module bulb base with said module socket to illuminate said bulb only in response to the reception by said microphone of a sound signal from an alarm device and an ON state in which said circuit means is caused to operatively interconnect said module bulb base with said module socket to illuminate said bulb regardless of whether said microphone receives a sound signal; and
   (g) lamp control switch means positioned on said module, connected to said circuit means, and selectively operable to switch said circuit means between said armed state and said ON state.

2. An arrangement as set forth in claim 1 wherein:
   (a) said circuit means includes filter means to render said arrangement responsive only to acoustic signals having a selected range of frequencies.

3. An arrangement as set forth in claim 1 wherein:
   (a) said circuit includes a delay timer whereby said circuit means only responds to acoustic signals existing for greater than a selected minimum duration 4. An arrangement as set forth in claim 1 including:
   (a) a photoelectric device positioned on said module, connected to said circuit means, and operative to cause the inhibition of said circuit means from responding to said sound signal upon the reception by said photoelectric device of greater than a selected intensity of light.

5. An arrangement as set forth in claim 1 including:
   (a) module removal prevention means on one of said module and said lamp socket assembly to resist the removal of said module from said lamp socket assembly.

6. An arrangement as set forth in claim 5 wherein:
   (a) said lamp bulb socket is a threaded socket, said module bulb base is a correspondingly threaded base, and said module base is screwed into said lamp bulb base;
   (b) said lamp socket assembly includes a standard lampshade supporting harp; and
   (c) said module removal prevention means includes at least one projecting lug positioned on said module to engage said harp upon the rotation of said module to thereby resist removal of said module from said lamp socket assembly.

7. An arrangement as set forth in claim 1 wherein said circuit means includes:
   (a) a peak detector having said microphone operatively connected thereto;

(b) an audio comparator having said peak detector connected to one input thereof and a reference voltage connected to another input thereof, said comparator outputting an activated logic level upon an acoustic signal received by said microphone causing an output signal from said peak detector to exceed said reference voltage;

(c) triac drive means having the output of said comparator operatively connected thereto and providing a gate signal in response to said activated logic level from said comparator; and (d) a triac connecting said lamp bulb across said electrical power line and having said triac drive means connected to a gate of said triac, said triac conducting electrical power from said power line through said lamp bulb to illuminate same in response to said gate signal.

8. An arrangement as set forth in claim 7 including:

(a) a logic gate operatively connecting said audio comparator to said triac drive means, said audio comparator being connected to a first input of said gate and said gate having a second input, said gate operatively passing said activated logic level to said triac drive means to cause the generation of said gate signal except when said gate is inhibited;

(b) a photoelectric device positioned on said module;

(c) a light signal comparator having said photoelectric device operatively connected to an input thereof and having an output connected to said second input of said logic gate, said light comparator outputting an activated logic level upon said photoelectric device sensing greater than a selected level of light; and (d) said activated logic level from said light comparator inhibiting said logic gate from passing said activated logic level from said audio comparator to said triac drive means.

9. An arrangement as set forth in in claim 8 wherein:

(a) said logic gate is a first logic gate;

(b) a second logic gate has the output of said first logic gate connected to a first input thereof and includes a second input, an output of said second logic gate being connected to said triac drive means; and (c) said lamp control switch means includes a lamp control switch connected through flip-flop means to said second input of said second logic gate, said lamp control switch and flip-flop means cooperating to provide a logic level to said second logic gate to cause the generation of said gate signal in response to alternate operation of said lamp control switch to allow selective illumination and deactivation of said lamp bulb in the absence of the reception of said acoustic signal by said microphone.

10. An arrangement as set forth in claim 7 including:

(a) a flasher oscillator connected to said triac drive means and operative to cause flashing operation of said lamp bulb upon the illumination thereof in response to the reception of said acoustic signal by said microphone.

* * * * *